US012666664B2

(12) United States Patent
Hwang et al.

(10) Patent No.: US 12,666,664 B2
(45) **Date of Patent: \*Jun. 23, 2026**

(54) MULTIPLE-DEPTH TRENCH ISOLATION FOR ELECTROSTATIC DISCHARGE PROTECTION DEVICES

(71) Applicant: GlobalFoundries Singapore Pte. Ltd., Singapore (SG)

(72) Inventors: Kyong Jin Hwang, Singapore (SG); Souvick Mitra, Essex Junction, VT (US)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 407 days.

This patent is subject to a terminal disclaimer.

(21) Appl. No.: 18/377,865

(22) Filed: Oct. 9, 2023

(65) Prior Publication Data

US 2025/0120137 A1    Apr. 10, 2025

(51) Int. Cl.
*H10D 62/10* (2025.01)
*H10D 10/60* (2025.01)
*H10D 84/60* (2025.01)

(52) U.S. Cl.
CPC ........... *H10D 62/115* (2025.01); *H10D 10/60* (2025.01); *H10D 84/645* (2025.01)

(58) Field of Classification Search
CPC ............ H10W 10/0123; H10D 89/711; H10D 84/125; H10D 89/931; H10D 10/60; H10D 62/184; H10D 62/113; H01L 21/76208; H01L 21/76229; H01L 62/184
See application file for complete search history.

(56) References Cited

U.S. PATENT DOCUMENTS

| | | | |
|---|---|---|---|
| 7,781,292 B2 * | 8/2010 | Gambino | .......... H10W 10/0143 |
| | | | 257/E29.256 |
| 10,249,611 B1 | 4/2019 | Xi et al. | |
| 11,756,953 B2 | 9/2023 | Chiang et al. | |
| 2009/0152680 A1 * | 6/2009 | Voldman | .............. H10D 89/711 |
| | | | 257/568 |

(Continued)

OTHER PUBLICATIONS

Jung, Jin-Woo & Koo, Yong-Seo. (2014). "A design of BJT-based ESD protection device combining SCR for high voltage power clamps. JSTS:Journal of Semiconductor Technology and Science." 14. 339-344. 10.5573/JSTS.2014.14.3.339.

(Continued)

*Primary Examiner* — Alia Sabur
(74) *Attorney, Agent, or Firm* — Thompson Hine LLP; Francois Pagette

(57) ABSTRACT

Structures including an electrostatic discharge protection device and methods of forming same. The structure comprises a semiconductor substrate having a top surface, an electrostatic discharge protection device including a base in the semiconductor substrate, and first and second trench isolation regions disposed in the base of the electrostatic discharge protection device. The first trench isolation region extends from the top surface of the semiconductor substrate to a first depth in the base, the second trench isolation region extends from the top surface of the semiconductor substrate to a second depth in the base, and the second depth greater than the first depth.

20 Claims, 5 Drawing Sheets

(56)　　　　　　References Cited

U.S. PATENT DOCUMENTS

| | | | |
|---|---|---|---|
| 2013/0093057 A1* | 4/2013 | Yamaoka ............. | H10D 89/711 |
| | | | 257/E29.174 |
| 2014/0319648 A1* | 10/2014 | Fenouillet-Beranger .................... | |
| | | | H10D 87/00 |
| | | | 257/506 |
| 2014/0347771 A1* | 11/2014 | Zhan ...................... | H02H 9/044 |
| | | | 257/111 |
| 2016/0071962 A1 | 3/2016 | Senapati et al. | |
| 2016/0111411 A1* | 4/2016 | Kalnitsky ............ | H10D 89/711 |
| 2017/0069616 A1 | 3/2017 | Cai et al. | |
| 2018/0053765 A1* | 2/2018 | Pendharkar .......... | H10D 84/856 |
| 2018/0145065 A1 | 5/2018 | Holland et al. | |
| 2018/0315747 A1* | 11/2018 | Agam .................. | H10D 62/115 |
| 2019/0333992 A1* | 10/2019 | Agam .................. | H10D 62/137 |
| 2020/0098741 A1* | 3/2020 | Zeng ..................... | H10D 89/713 |
| 2020/0321328 A1* | 10/2020 | Jou ........................ | H02H 9/046 |
| 2020/0328204 A1 | 10/2020 | Salman et al. | |
| 2020/0403103 A1 | 12/2020 | Pjencak et al. | |
| 2023/0187268 A1* | 6/2023 | Park .................... | H10W 10/021 |
| | | | 257/343 |

OTHER PUBLICATIONS

Hwang, Kyongjin et al., "Electrostatic Discharge Control Devices" filed on Oct. 27, 2022 as a U.S. Appl. No. 17/974,823.
Hwang, Kyongjin et al., "Electrostatic Discharge Protection Devices With Multiple-Depth Trench Isolation" filed on Dec. 8, 2022 as a U.S. Appl. No. 18/077,299.
Hwang, Kyong Jin et al., "Electrostatic Discharge Devices" filed on Apr. 27, 2023 as a U.S. Appl. No. 18/308,322.
European Patent Office, Extended European Search Report and Opinion issued in European Patent Application No. 24168620.3 on Sep. 18, 2024; 8 pages.

* cited by examiner

MULTIPLE-DEPTH TRENCH ISOLATION FOR ELECTROSTATIC DISCHARGE PROTECTION DEVICES

BACKGROUND

The disclosure relates generally to semiconductor devices and integrated circuit fabrication and, more specifically, to structures including an electrostatic discharge protection device and methods of forming same.

An integrated circuit may be exposed to random electrostatic discharge (ESD) events that can cause damage to sensitive electronic devices of the integrated circuit. An ESD event refers to an unpredictable electrical discharge of a positive or negative current occurring over a short duration and during which a potentially large and damaging amount of current is directed toward the sensitive devices of the integrated circuit. An ESD event may occur during post-manufacture chip handling or following chip assembly to a printed circuit board or other carrier. An ESD event may originate from a variety of sources, such as a human body, a machine component, or a chip carrier.

Precautions may be taken to protect the integrated circuit from damage during an ESD event. One such precaution is to provide an on-chip protection circuit that is designed to avert damage to the sensitive devices of the integrated circuit during an ESD event. If an ESD event occurs, the protection circuit triggers a protection device to enter a low-impedance state that conducts the ESD current to ground and thereby shunts the ESD current away from the sensitive devices of the integrated circuit. The protection device remains clamped in its low-impedance state until the ESD current is drained and the ESD voltage is discharged to an acceptable level.

Improved structures including an electrostatic discharge protection device and methods of forming same are needed.

SUMMARY

In an embodiment, a structure comprises a semiconductor substrate having a top surface, an electrostatic discharge protection device including a base in the semiconductor substrate, a first trench isolation region disposed in the base of the electrostatic discharge protection device, and a second trench isolation region disposed in the base of the electrostatic discharge protection device. The first trench isolation region extends from the top surface of the semiconductor substrate to a first depth in the base, the second trench isolation region extends from the top surface of the semiconductor substrate to a second depth in the base, and the second depth greater than the first depth.

In an embodiment, a method comprises forming an electrostatic discharge protection device including a base in a semiconductor substrate, forming a first trench isolation region disposed in the base of the electrostatic discharge protection device, and forming a second trench isolation region disposed in the base of the electrostatic discharge protection device. The first trench isolation region extends from a top surface of the semiconductor substrate to a first depth in the base, the second trench isolation region extends from the top surface of the semiconductor substrate to a second depth in the base, and the second depth is greater than the first depth.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals are used to indicate like features in the various views.

DETAILED DESCRIPTION

Figure 1:
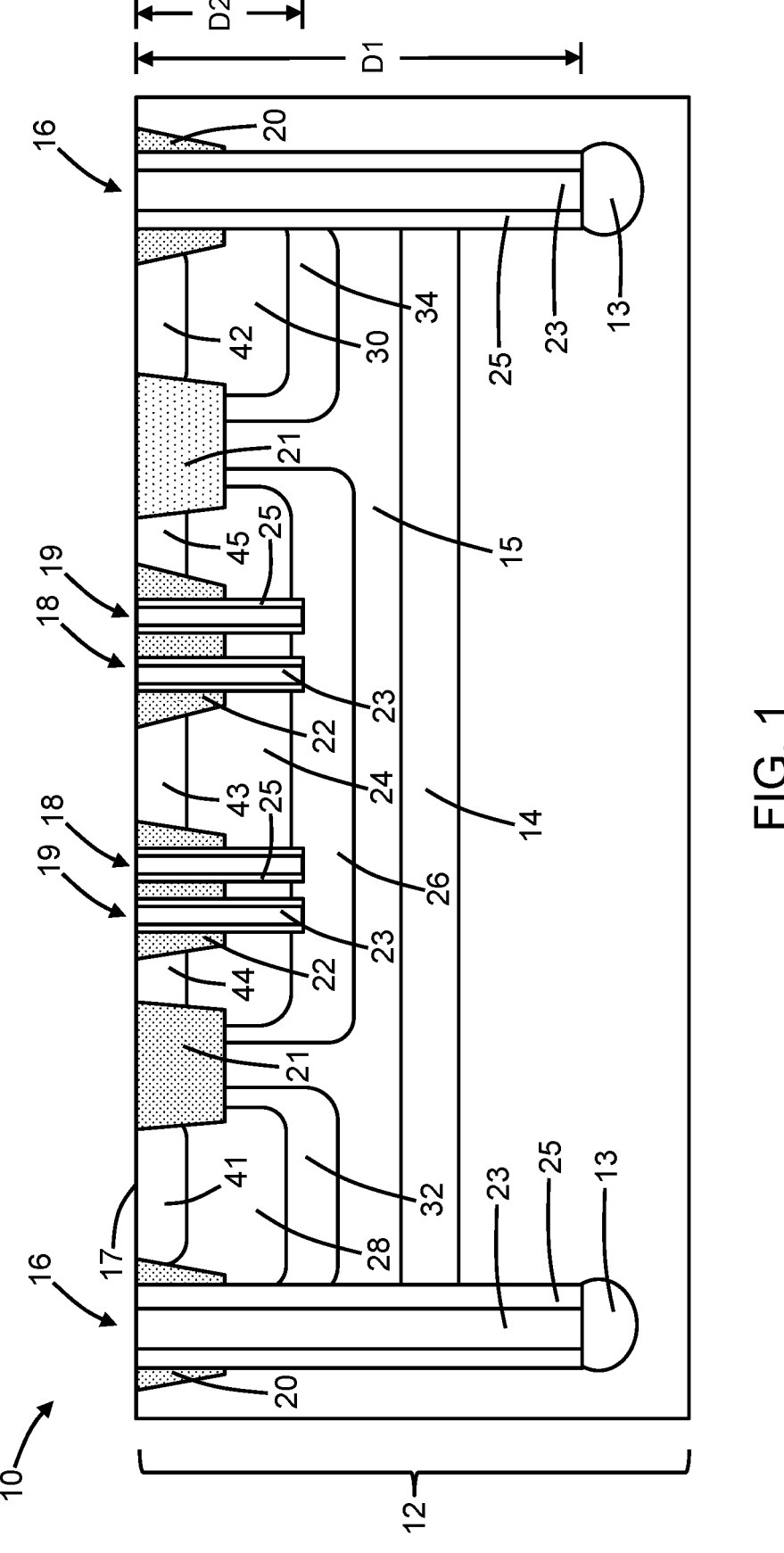
FIG. 1 is a cross-sectional view of a structure in accordance with embodiments of the invention.

With reference to FIG. 1 and in accordance with embodiments of the invention, a device structure 10 for an electrostatic discharge protection device includes a semiconductor substrate 12, a deep well 14 in the semiconductor substrate, a deep trench isolation region 16, intermediate trench isolation regions 18, 19, and shallow trench isolation regions 20, 21, 22. The semiconductor substrate 12 may include a semiconductor layer 15 that is surrounded on multiple sides by the deep well 14 and the deep trench isolation region 16. The semiconductor substrate 12 may be comprised of a semiconductor material, such as single-crystal silicon. In an embodiment, the semiconductor layer 15, which may be epitaxially grown, may be comprised of a semiconductor material, such as single-crystal silicon, that is doped to have n-type conductivity.

The deep well 14 is doped to have the same conductivity type as the semiconductor layer 15 but at a higher dopant concentration. In an embodiment, the deep well 14 may contain a concentration of an n-type dopant, such as arsenic or phosphorus, such that the deep well 14 has n-type conductivity. In an embodiment, the deep well 14 may be formed by introducing an n-type dopant by, for example, a masked ion implantation into the semiconductor substrate 12. The implantation conditions, such as ion species, dose, and kinetic energy, may be selected to tune the electrical and physical characteristics of the deep well 14.

The deep trench isolation region 16, the intermediate trench isolation regions 18, 19, and the shallow trench isolation regions 20, 21, 22 extend from a top surface 17 of the semiconductor substrate 12 to different depths into the semiconductor substrate 12. In particular, the deep trench isolation region 16 extends from the top surface 17 to a greater depth in the semiconductor substrate 12 than the intermediate trench isolation regions 18, 19. In an embodiment, the deep trench isolation region 16 may extend from the top surface 17 to a depth D1 in the semiconductor substrate 12, the intermediate trench isolation regions 18, 19 may extend from the top surface 17 to a depth D2 in the semiconductor substrate 12, and the shallow trench isolation regions 20, 21, 22 may extend from the top surface 17 to a depth that is less than the depth D2. The depth D2 of the intermediate trench isolation regions 18, 19 is greater than the depth of the shallow trench isolation regions 20, 21, 22, and the depth D1 of the deep trench isolation region 16 is greater than the depth D2 of the intermediate trench isolation regions 18, 19.

The deep trench isolation region 16 may be arranged to penetrate through a portion of the shallow trench isolation region 20. The intermediate trench isolation regions 18, 19 may be arranged to penetrate through different portions of the shallow trench isolation region 22. The shallow trench isolation region 21 is laterally disposed between the deep trench isolation region 16 and the intermediate trench isolation regions 18, 19. The shallow trench isolation regions 21, 22 and the intermediate trench isolation regions 18, 19 are surrounded by the deep trench isolation region 16.

The shallow trench isolation regions 20, 21, 22 may be formed by patterning shallow trenches with lithography and etching processes, depositing a dielectric material, such as silicon dioxide, in the shallow trenches, and planarizing and/or recessing the deposited dielectric material. The deep trench isolation region 16 and intermediate trench isolation regions 18, 19 may be formed by patterning trenches in the semiconductor substrate 12, lining the trenches with a dielectric collar 25, and filling the trenches with a conductor layer 23. The dielectric collar 25 may be comprised of a dielectric material, such as silicon dioxide, that is an electrical insulator and the conductor layer 23 may be comprised of a conductor, such as doped polysilicon. The trenches used to form the intermediate trench isolation regions 18, 19 may be patterned with a narrower width than the trench used to form the deep trench isolation region 16, which results in the shallower depth for the intermediate trench isolation regions 18, 19 in comparison with the deep trench isolation region 16. A doped region 13 may be formed by a masked ion implantation at the base of the trench used to form the deep trench isolation region 16 before forming the dielectric collar 25 and the conductor layer 23. In an embodiment, the doped region 13 may contain a concentration of a p-type dopant, such as boron, such that the doped region 13 has p-type conductivity.

Wells 24, 26 may be disposed in the semiconductor substrate 12 with the well 24 positioned in a vertical direction between the well 26 and the top surface 17. The shallow trench isolation region 22 is fully positioned in the well 24, and a portion of the shallow trench isolation region 21 is positioned in the well 24. Wells 28, 30 may be disposed in the semiconductor substrate 12 between the deep trench isolation region 16 and the wells 24, 26. Wells 28, 30 may be respectively positioned in a vertical direction between the wells 32, 34 and the top surface 17.

In an embodiment, the wells 24, 26 may contain a concentration of a p-type dopant, such as boron, to provide p-type conductivity. The well 24 may have a higher dopant concentration than the well 26. The well 24 may be formed by selectively implanting ions, such as ions including the p-type dopant, with an implantation mask having an opening defining the intended location for the well 24 in the semiconductor substrate 12. The well 26 may be formed by selectively implanting ions, such as ions including the p-type dopant, with an implantation mask having an opening defining the intended location for the well 26 in the semiconductor substrate 12. The implantation conditions, such as ion species, dose, kinetic energy, may be selected to tune the electrical and physical characteristics of the wells 24, 26.

In an embodiment, the wells 28, 30 and the wells 32, 34 may contain a concentration of an n-type dopant, such as arsenic or phosphorus, to provide n-type conductivity. The wells 28, 30 may have a higher dopant concentration than the wells 32, 34, and the wells 32, 34 may have a higher dopant concentration than the semiconductor layer 15 of the semiconductor substrate 12. The wells 28, 30 may be formed by selectively implanting ions, such as ions including the n-type dopant, with an implantation mask having openings defining the intended locations for the wells 28, 30 in the semiconductor substrate 12. The wells 32, 34 may be concurrently formed by selectively implanting ions, such as ions including the n-type dopant, with an implantation mask having openings defining the intended locations for the wells 32, 34 in the semiconductor substrate 12. The implantation conditions, such as ion species, dose, and kinetic energy, may be selected to tune the electrical and physical characteristics of the wells 28, 30 and the wells 32, 34.

A doped region 41 is disposed in the well 28, a doped region 42 is disposed in the well 30, and a doped region 43 is disposed in the well 24. The doped regions 41, 42, 43 are positioned adjacent to the top surface 17. The doped region 43 is surrounded by the shallow trench isolation region 22.

The doped regions 41, 42 may be doped to have the same conductivity type as the wells 28, 30 but at a higher dopant concentration, and the doped region 43 may be doped to have an opposite conductivity type from the well 24. In an embodiment, the doped regions 41, 42, 43 may contain a concentration of an n-type dopant, such as arsenic or phosphorus, to provide n-type conductivity. The doped regions 41, 42, 43 may be concurrently formed by selectively implanting ions, such as ions including the n-type dopant, with an implantation mask having openings defining the intended locations for the doped regions 41, 42, 43 in the semiconductor substrate 12. The implantation conditions, such as ion species, dose, and kinetic energy, may be selected to tune the electrical and physical characteristics of the doped regions 41, 42, 43.

Doped regions 44, 45 are positioned in the well 24. The doped regions 44, 45 are located adjacent to the top surface 17. The doped regions 44, 45 may be doped to have the same conductivity type as the well 24 but at a higher dopant concentration. In an embodiment, the doped regions 44, 45 may contain a concentration of a p-type dopant, such as boron, to provide p-type conductivity. The doped regions 44, 45 may be concurrently formed by selectively implanting ions, such as ions including the p-type dopant, with an implantation mask having openings defining the intended locations for the doped regions 44, 45 in the semiconductor substrate 12. The implantation conditions, such as ion species, dose, and kinetic energy, may be selected to tune the electrical and physical characteristics of the doped regions 44, 45. The shallow trench isolation region 22 is positioned between the doped regions 44, 45 and the doped region 43.

The deep trench isolation region 16 may penetrate through the deep well 14 and into a portion of the semiconductor substrate 12 beneath the deep well 14. In an embodiment, the intermediate trench isolation regions 18, 19 may penetrate fully through the well 24 and partially through the well 26 such that bottom portions of the intermediate trench isolation regions 18, 19 are disposed within the well 26 and the bottom portions of the intermediate trench isolation regions 18, 19 terminate inside the well 26.

The device structure 10 for the electrostatic discharge protection device may be characterized as a bipolar transistor structure that includes an emitter represented by the doped region 43, a base represented by the wells 24, 26, and a collector collectively represented by semiconductor layer 15, the wells 28, 30, and the wells 32, 34. The semiconductor layer 15, the wells 28, 30, and the wells 32, 34 of the collector are all doped to have the same conductivity type, such as n-type conductivity, but with various different dopant concentrations. The collector is doped to have the same conductivity type as the emitter and an opposite conductivity type from the base. In an embodiment, the well 28 may be continuous with the well 30, the continuous wells 28, 30 may surround the base and emitter, the well 32 may be continuous with the well 34, and the continuous wells 32, 34 may surround the base and emitter.

The intermediate trench isolation regions 18, 19 and the shallow trench isolation region 22 are disposed in the base. The intermediate trench isolation regions 18, 19, which surround the doped region 43 representing the emitter, extend to the depth D2 in the base. The shallow trench isolation region 22, which also surrounds the doped region 43 representing the emitter, extends to a depth in the base that is less than the depth D2. The base may be considered to wrap about the intermediate trench isolation regions 18, 19 by being physically located on multiple sides of the intermediate trench isolation regions 18, 19. In that regard, the intermediate trench isolation regions 18, 19 may penetrate partially through the base such that a portion of the well 26 extends beneath the intermediate trench isolation regions 18, 19. The deep trench isolation region 16 surrounds the emitter, base, and collector, and also surrounds the intermediate trench isolation regions 18, 19.

Figure 2:
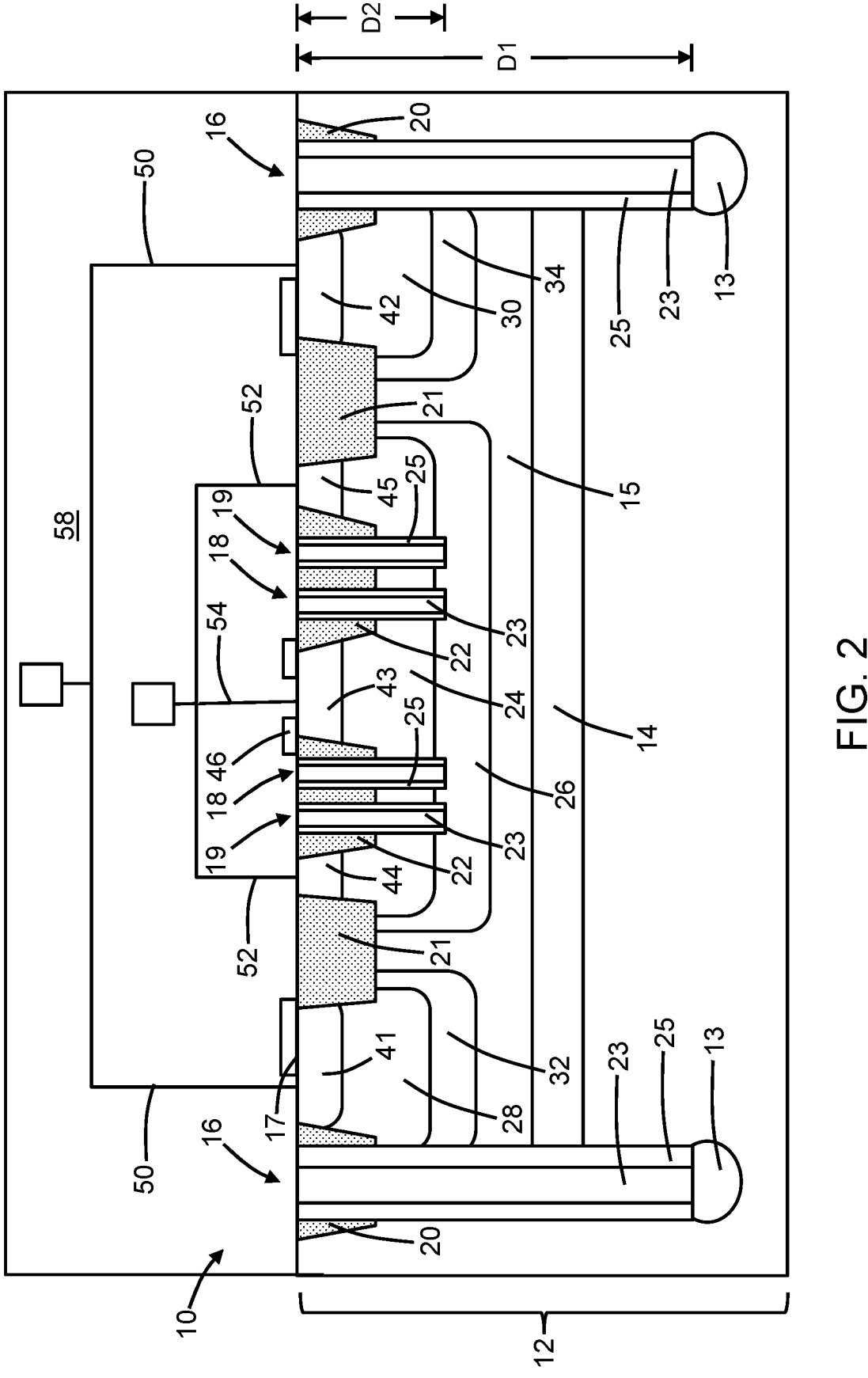
FIG. 2 is a cross-sectional view of the structure at a fabrication stage subsequent to FIG. 1.

With reference to FIG. 2 in which like reference numerals refer to like features in FIG. 1 and at a subsequent fabrication stage, a dielectric layer 46 may be formed that includes sections positioned on the top surface 17 of the semiconductor substrate 12. The dielectric layer 46 may be comprised of a dielectric material, such as silicon nitride, that is deposited and then patterned by lithography and etching processes to form the sections. One section of the dielectric layer 46 has an overlapping relationship with a portion of the doped region 41. Another section of the dielectric layer 46 has an overlapping relationship with a portion of the doped region 42. Other portions of the doped regions 41, 42, which are adjacent to the shallow trench isolation region 20, are not overlapped by the sections of the dielectric layer 46. Sections of the dielectric layer 46 have an overlapping relationship with portions of the doped region 43 adjacent to the shallow trench isolation region 22, and another portion of the doped region 43 is not overlapped by the sections of the dielectric layer 46. The sections of the dielectric layer 46 may function as a silicide-blocking layer.

The device structure 10 may include an interconnect structure 58 formed by middle-of-line processing and back-end-of-line processing. The interconnect structure 58 may include electrical connections 50, 52, 54 that are coupled to the electrostatic discharge protection device. The electrical connections 50, 52, 54 may include metal features that are disposed in one or more dielectric layers of the interconnect structure 58.

The electrical connections 50 are physically and electrically connected to portions of the doped regions 41, 42 that are not covered by the sections of the dielectric layer 46, and the electrical connections 50 supply connections through the doped regions 41, 42 to the semiconductor layer 15, the wells 28, 30, and the wells 32, 34 providing the collector. The electrical connections 52 are physically and electrically connected to the doped regions 44, 45 disposed in the well 24 of the base. The electrical connection 54 is physically and electrically connected to the doped region 43 providing the emitter. The doped regions 44, 45 are connected to the doped region 43 by the electrical connections 52 such that the base and emitter are connected. Silicide (not shown) may be formed on portions of the doped regions 41, 42, 43, 44, 45 that are not covered by the sections of the dielectric layer 46.

The resistivity of the base is increased by the presence of the intermediate trench isolation regions 18, 19, which provide a resistance that is internal to the device structure 10. The intermediate trench isolation regions 18, 19 are disposed in a lateral direction between the electrical connections 52 to the base and the emitter. As a result, the internal resistance between the emitter and base introduced by the intermediate trench isolation regions 18, 19 enable the elimination of one or more external resistors that are connected between the base and the emitter in conventional device structures, which reduces the footprint of the device structure 10. The intermediate trench isolation regions 18, 19 may also function to reduce the triggering voltage of the device structure 10.

Figure 3:
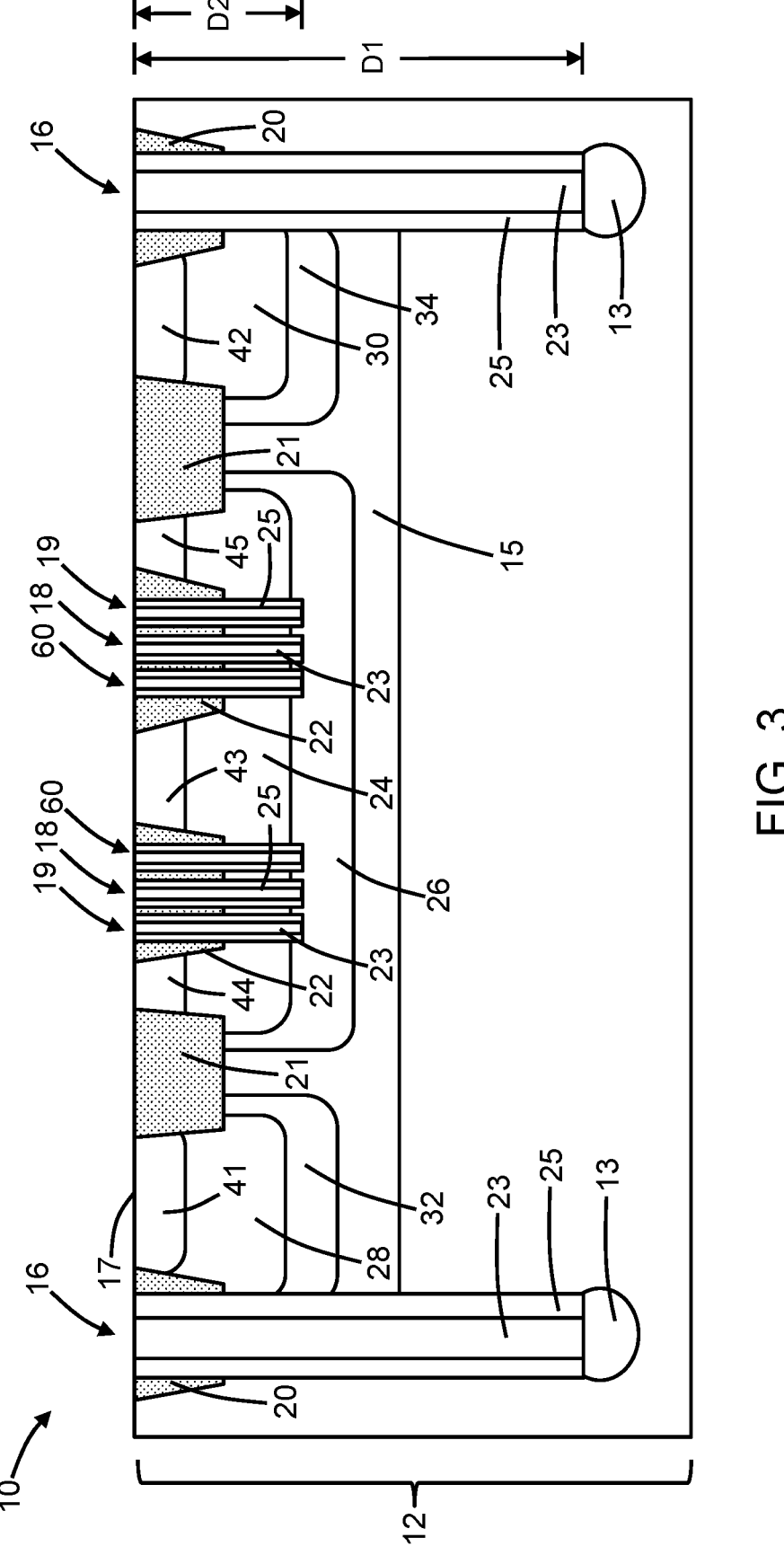
FIG. 3 is a cross-sectional view of a structure in accordance with alternative embodiments of the invention.

With reference to FIG. 3 in which like reference numerals refer to like features in FIG. 1 and in accordance with alternative embodiments of the invention, the deep well 14 may be eliminated, and an additional the intermediate trench isolation region 60 may be formed along with the intermediate trench isolation regions 18, 19. In an embodiment, the intermediate trench isolation region 60 may be identical to the intermediate trench isolation regions 18, 19. The intermediate trench isolation region 60 may increase the internal resistance between the emitter and base.

Figure 4:
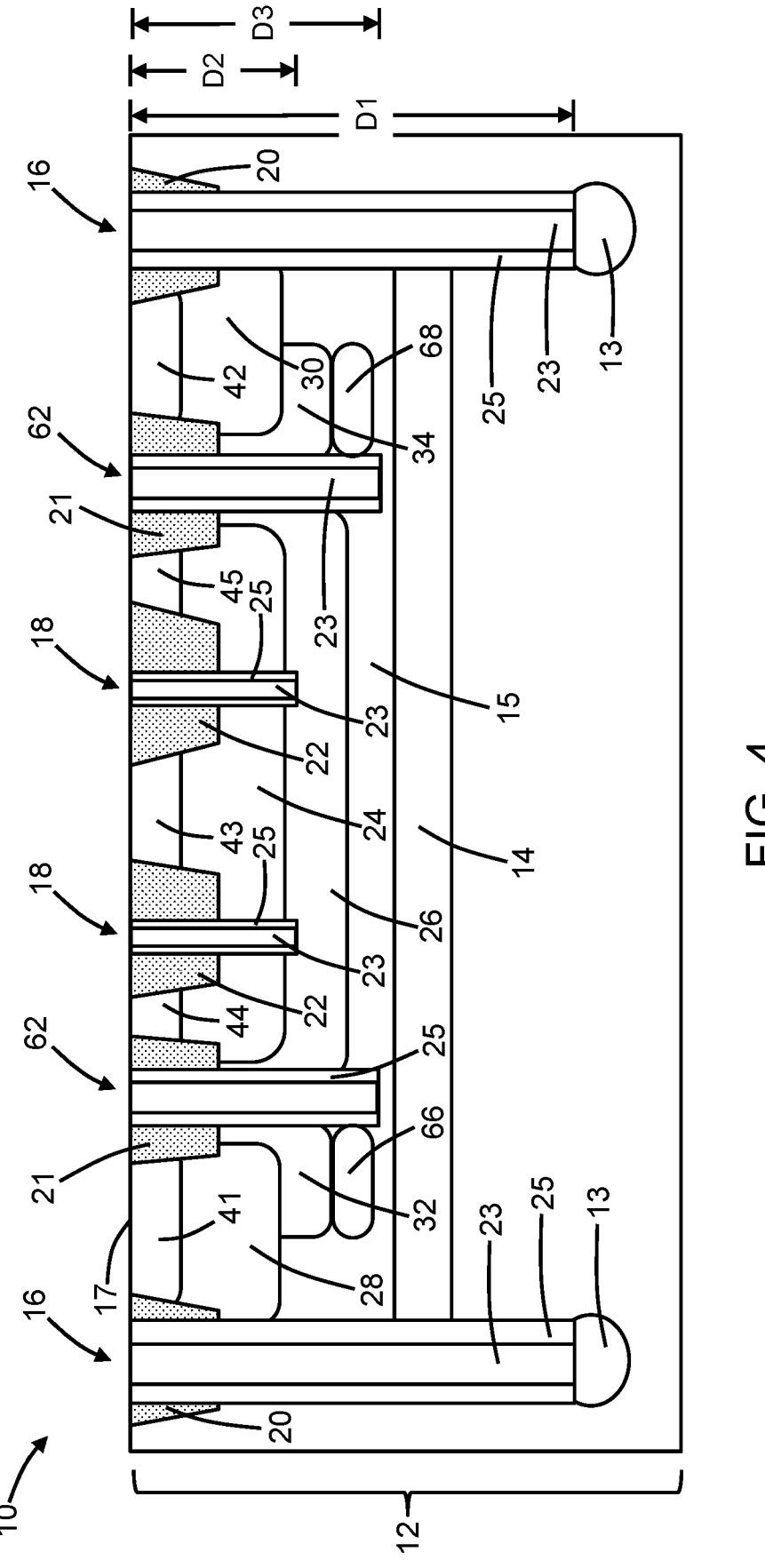
FIG. 4 is a cross-sectional view of a structure in accordance with alternative embodiments of the invention.

With reference to FIG. 4 in which like reference numerals refer to like features in FIG. 1 and in accordance with alternative embodiments of the invention, the device structure 10 for the electrostatic discharge protection device may be modified to form a vertical silicon-controlled rectifier by eliminating the intermediate trench isolation region 18, adding doped regions 66, 68, and adding a trench isolation region 62 that extends to a different depth in the semiconductor substrate 12 than the deep trench isolation region 16 or the intermediate trench isolation region 18. In particular, the trench isolation region 62 extends from the top surface 17 to a greater depth in the semiconductor substrate 12 than the intermediate trench isolation region 18 and to a shallower depth in the semiconductor substrate 12 than the deep trench isolation region 16. In an embodiment, the trench isolation region 62 may extend to a depth D3 in the semiconductor substrate 12 that is greater than the depth D2 of the intermediate trench isolation region 18 and that is less than the depth D1 of the deep trench isolation region 16.

The trench isolation region 62 may be arranged to penetrate through the shallow trench isolation region 21 and into the semiconductor substrate 12 beneath the shallow trench isolation region 21. The trench isolation region 62 is positioned between the deep trench isolation region 16 and the intermediate trench isolation region 18. The trench isolation region 62 surrounds the shallow trench isolation regions 21, 22 and the intermediate trench isolation region 18, and the trench isolation region 62 is surrounded by the deep trench isolation region 16. The trench isolation region 62 may be formed when the deep trench isolation region 16 and intermediate trench isolation region 18 is formed, and may include portions of the dielectric collar 25 and conductor layer 23. The trench used to form the trench isolation region 62 may be patterned with a greater width than the trench used to form the intermediate trench isolation region 18 and a narrower width than the trench used to form the deep trench isolation region 16, which results in the greater depth for the trench patterned to form the trench isolation region 62 in comparison with the trench patterned to form the intermediate trench isolation region 18.

The doped regions 66, 68 may be formed the semiconductor substrate 12 by introducing a dopant of a given conductivity type by, for example, ion implantation into the semiconductor substrate 12. A patterned implantation mask may be formed to define selected areas on the top surface 17 that are exposed for the implantation of ions. The implantation conditions, such as ion species, dose, and kinetic energy, may be selected to tune the electrical and physical characteristics of the doped regions 66, 68. The doped regions 66, 68 are doped to have an opposite conductivity type from wells 28 30, and the wells 32, 34. In an embodiment, the doped regions 66, 68 may contain a concentration of a p-type dopant, such as boron, to provide p-type conductivity.

Figure 5:
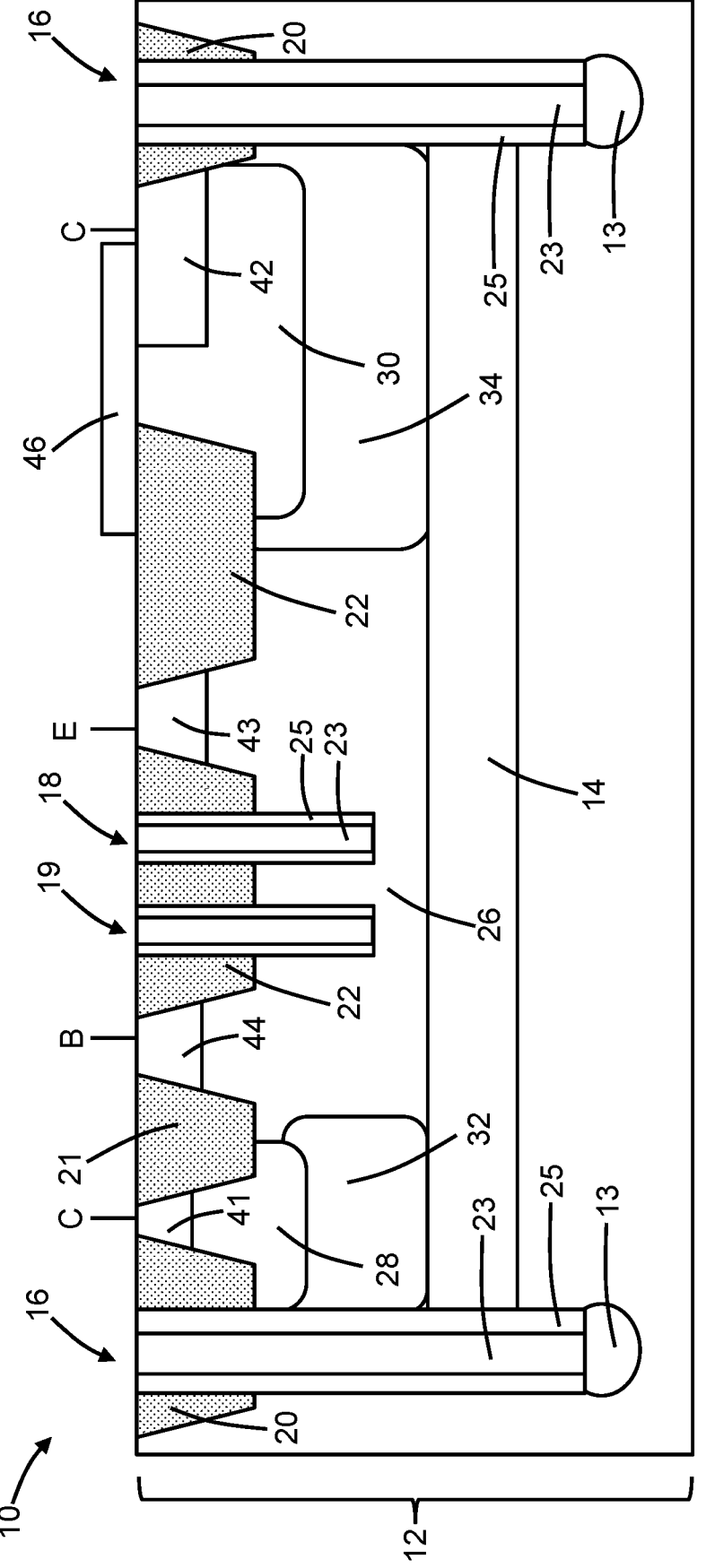
FIG. 5 is a cross-sectional view of a structure in accordance with alternative embodiments of the invention.

With reference to FIG. 5 in which like reference numerals refer to like features in FIG. 1 and in accordance with alternative embodiments of the invention, the device structure 10 for the electrostatic discharge protection device may be modified to form a lateral bipolar junction transistor. The doped region 43 may represent an emitter (E) of the lateral bipolar junction transistor, the well 26 may represent a base (B) of the lateral bipolar junction transistor, and the wells 28, 30, and the wells 32, 34 may represent a collector (C) of the lateral bipolar junction transistor. The intermediate trench isolation regions 18, 19, which surround the doped region 43 representing the emitter, penetrate into the well 26 representing the base and partially through the well 26. The resistivity of the base is increased by the presence of the intermediate trench isolation regions 18, 19, which provide a resistance that is internal to the device structure 10.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a semiconductor substrate having a top surface;
an electrostatic discharge protection device including a base in the semiconductor substrate;
a first trench isolation region disposed in the base of the electrostatic discharge protection device, the first trench isolation region extending from the top surface of the semiconductor substrate to a first depth in the base; and
a second trench isolation region disposed in the base of the electrostatic discharge protection device, the second trench isolation region extending from the top surface of the semiconductor substrate to a second depth in the base, and the second depth greater than the first depth.

2. The structure of claim 1 wherein the electrostatic discharge protection device includes a collector in the semiconductor substrate and an emitter in the semiconductor substrate, the collector and the emitter have a first conductivity type, and the base has a second conductivity type opposite from the first conductivity type.

3. The structure of claim 2 wherein the second trench isolation region surrounds the emitter.

4. The structure of claim 3 wherein the first trench isolation region surrounds the emitter, and the second trench isolation region penetrates through a portion of the first trench isolation region into the base.

5. The structure of claim 2 further comprising:
a third trench isolation region disposed in the semiconductor substrate, the third trench isolation region extending from the top surface of the semiconductor substrate to a third depth that is greater than the second depth.

6. The structure of claim 5 wherein the third trench isolation region surrounds the emitter, the base, the first trench isolation region, and the second trench isolation region.

7. The structure of claim 6 further comprising:
a fourth trench isolation region disposed in the semiconductor substrate, the fourth trench isolation region extending from the top surface of the semiconductor substrate to a fourth depth that is greater than the third depth.

8. The structure of claim 7 wherein the fourth trench isolation region surrounds the collector, the emitter, the base, the first trench isolation region, and the second trench isolation region.

9. The structure of claim 1 further comprising:
a third trench isolation region disposed in the semiconductor substrate, the third trench isolation region extending from the top surface of the semiconductor substrate to the second depth in the base.

10. The structure of claim 9 wherein the electrostatic discharge protection device includes a collector in the semiconductor substrate and an emitter in the semiconductor substrate, the collector and the emitter have a first conductivity type, the base has a second conductivity type opposite from the first conductivity type, and the second trench isolation region and the third trench isolation region surround the emitter.

11. The structure of claim 10 wherein the first trench isolation region surrounds the emitter, the second trench isolation region extends through a first portion of the first trench isolation region into the base, and the third trench isolation region penetrates through a second portion of the first trench isolation region into the base.

12. The structure of claim 9 wherein the base wraps around the second trench isolation region and the third trench isolation region.

13. The structure of claim 9 further comprising:
a fourth trench isolation region disposed in the semiconductor substrate, the fourth trench isolation region extending from the top surface of the semiconductor substrate to the second depth in the base.

14. The structure of claim 1 wherein the second trench isolation region penetrates partially through the base.

15. The structure of claim 1 further comprising:
a third trench isolation region positioned in the semiconductor substrate, the third trench isolation region surrounding the base, the first trench isolation region, and the second trench isolation region, and the third trench isolation region extending to a third depth in the semiconductor substrate that is greater than the second depth.

16. The structure of claim 15 wherein the electrostatic discharge protection device includes a collector in the semiconductor substrate and an emitter in the semiconductor substrate, the collector and the emitter has a first conductivity type, and the base has a second conductivity type opposite from the first conductivity type.

17. The structure of claim 16 wherein the second trench isolation region surrounds the emitter, and the third trench isolation region surrounds the emitter and the collector.

18. The structure of claim 1 wherein the second trench isolation region penetrates through a portion of the first trench isolation region into the base.

19. The structure of claim 1 wherein the base wraps around the first trench isolation region.

20. A method comprising:
forming an electrostatic discharge protection device including a base in a semiconductor substrate;
forming a first trench isolation region disposed in the base of the electrostatic discharge protection device; and
forming a second trench isolation region disposed in the base of the electrostatic discharge protection device,
wherein the first trench isolation region extends from a top surface of the semiconductor substrate to a first depth in the base, the second trench isolation region extends from the top surface of the semiconductor substrate to a second depth in the base, and the second depth is greater than the first depth.

* * * * *